United States Patent
Tan et al.

(10) Patent No.: US 11,288,037 B1
(45) Date of Patent: Mar. 29, 2022

(54) VOLUME ADJUSTMENT ASSEMBLY FOR PORTABLE COMMUNICATION DEVICE

(71) Applicant: MOTOROLA SOLUTIONS, INC., Chicago, IL (US)

(72) Inventors: Beng Kwang Tan, Penang (MY); Boon Kheng Hooi, Penang (MY); Murali Kuyimbil, Penang (MY); Wai Mun Lee, Perak (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 17/095,601

(22) Filed: Nov. 11, 2020

(51) Int. Cl.
  *G06F 3/16* (2006.01)
  *H03G 3/32* (2006.01)
  *H04R 3/00* (2006.01)

(52) U.S. Cl.
  CPC ............... *G06F 3/165* (2013.01); *H03G 3/32* (2013.01); *H04R 3/00* (2013.01); *H04R 2430/01* (2013.01)

(58) Field of Classification Search
  CPC .. G06F 3/165; H03G 3/32; H04R 3/00; H04R 2430/01
  See application file for complete search history.

(56) References Cited

U.S. PATENT DOCUMENTS

| | | | |
|---|---|---|---|
| 3,878,731 A | 4/1975 | Huegli | |
| 3,970,986 A * | 7/1976 | Seyler | H01C 10/36 338/171 |
| 4,439,654 A * | 3/1984 | Bresin | H01H 19/06 200/302.1 |
| 6,028,502 A * | 2/2000 | McSwiggen | H01C 10/32 200/11 G |
| 7,592,562 B1 * | 9/2009 | Vanderwege | H01H 3/20 200/336 |
| 8,415,577 B2 * | 4/2013 | Garcia | B60K 37/06 200/564 |
| 9,287,025 B2 * | 3/2016 | Pizzato | H01C 10/14 |
| 9,631,700 B2 | 4/2017 | Edinger et al. | |
| 2003/0160711 A1 * | 8/2003 | Jorgensen | G01D 5/165 341/16 |
| 2014/0033857 A1 * | 2/2014 | Currier | G05G 1/12 74/553 |

FOREIGN PATENT DOCUMENTS

| EP | 2764524 B1 | 12/2016 |
|---|---|---|
| JP | 4749311 B2 | 8/2011 |

* cited by examiner

*Primary Examiner* — Joseph Saunders, Jr.
(74) *Attorney, Agent, or Firm* — Michael Best & Friedrich LLP

(57) ABSTRACT

An adjustment assembly includes an adjustment knob configured to be rotated about an axis, a potentiometer, and an adapter configured to be disposed between and coupled to both the adjustment knob and the potentiometer. The adapter is configured to be rotated about the axis to move the potentiometer from a first position along the axis to a second position along the axis.

21 Claims, 4 Drawing Sheets

VOLUME ADJUSTMENT ASSEMBLY FOR PORTABLE COMMUNICATION DEVICE

BACKGROUND OF THE INVENTION

Portable communication devices commonly include various controls and interfaces, such as a micro universal serial bus (micro USB) port, an audio jack, and a volume adjustment assembly that includes a volume potentiometer. Ideally, these components are placed at locations on or along the device for best ergonomic results. It is also desirable to allow freedom to access each individual control or interface, yet also permit sealing of the portable communication device from water and debris. For example, some portable communication devices are intended to meet certain industry standards or ratings, such as an IP68 waterproof rating.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
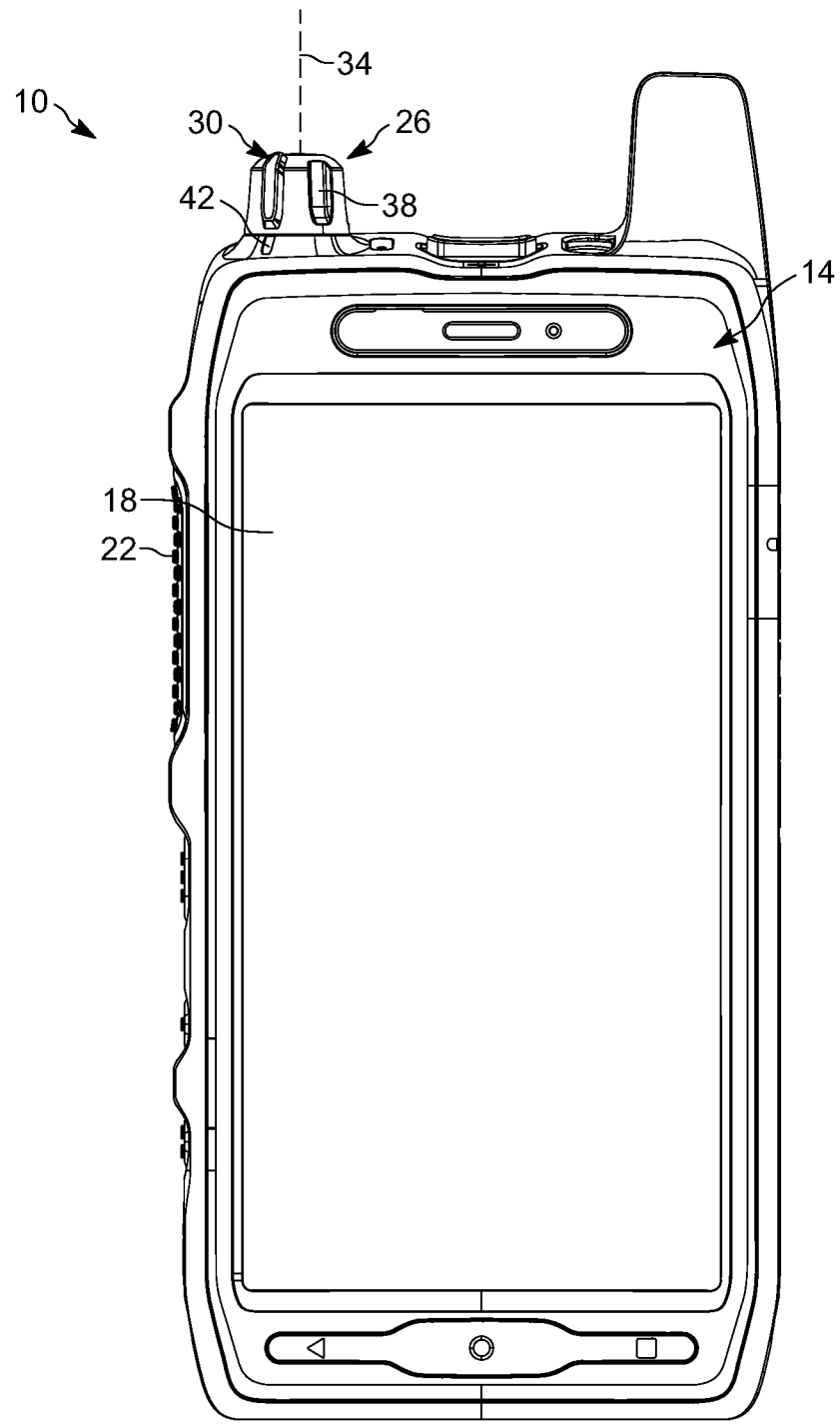
FIG. 1 is a front view of a portable communication device that includes a volume adjustment assembly in accordance with one embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

As noted above, portable communication devices often incorporate various controls and interfaces including, for example, a volume adjustment assembly that includes a potentiometer that works in conjunction with a rotary knob.

When controls and interfaces are designed for preferred ergonomic locations, but are located at very different faces/planes along the device, structural design if often complicated, especially when the device is intended to be an IP68-rated device. Additionally, many portable communication devices include an adjustment knob (for example a rotary knob) that works in conjunction with the volume potentiometer. It is highly challenging to implement a rotary knob/switch with a shaft in a slim portable communication device, and to seamlessly seal a volume potentiometer.

However, it is important that certain portable communication devices remain rated as waterproof, and that there be an ability and freedom to access the controls and interfaces even with a slim device. Additionally, there is a desire to be able to access and replace components of the controls and interfaces without needing to fully or substantially disassemble the portable communication device. Accordingly, there is a need for improved systems and methods for a volume adjustment assembly for a portable communication device.

Briefly, there is provided herein an improved adjustment assembly (for example volume adjustment assembly) for a portable communication device. The adjustment assembly, according to one embodiment, includes an adjustment knob configured to be rotated about an axis, a potentiometer, and an adapter configured to be disposed between and coupled to both the adjustment knob and the potentiometer. The adapter is configured to be rotated about the axis to move the potentiometer from a first position along the axis to a second position along the axis.

There is also provided a method of assembling a portable communication device. The method, according to one embodiment, includes coupling an adjustment knob to an adapter, and rotating the adapter to draw a potentiometer from a first position within the portable communication device to a second position within the portable communication device. Other embodiments will become apparent from the description and drawings provided.

FIG. 1 illustrates a portable communication device 10. In the examples shown, the portable communication device includes a main housing 14, a display 18 coupled to the main housing 14 along a front of the main housing 14, a push-to-talk button 22 coupled to the main housing 14 along a side of the main housing 14, and a volume adjustment assembly 26 coupled to the main housing 14 along a top of the main housing 14. The illustrated portable communication device 10 is a portable radio. While the volume adjustment assembly 26 is described in the context of being used with the illustrated portable radio, the volume adjustment assembly 26 may be used with other portable communication devices 10 (for example cellular phones, tablets, and the like). Additionally, while the volume adjustment assembly 26 is described in the context of adjusting the volume level on a portable communication device, in other embodiments it may be used to adjust something other than a volume level on a portable communication device.

In the embodiment illustrated in FIGS. 1-4, the volume adjustment assembly 26 includes an adjustment knob 30. The adjustment knob 30 is a rotary knob that rotates about an axis 34. The adjustment knob 30 includes an outer surface 38 that may be gripped and turned to rotate the adjustment knob 30 about the axis 34. The outer surface 38 may include, for example, ribs or other protrusions that facilitate gripping. In a fully assembled state (FIGS. 1 and 4), the adjustment knob 30 is disposed adjacent to, or in contact with, an outer surface 42 of the main housing 14, such that the entire adjustment knob 30 is disposed outside of the main housing 14 in close proximity to the main housing 14. Other embodiments include adjustment knobs 30 having shapes and sizes other than that illustrated, as well as positions other than that illustrated. In some embodiments a portion or portions of the adjustment knob 30 extend past the outer surface 42 so as to be disposed at least partially within the main housing 14.

Figure 2:
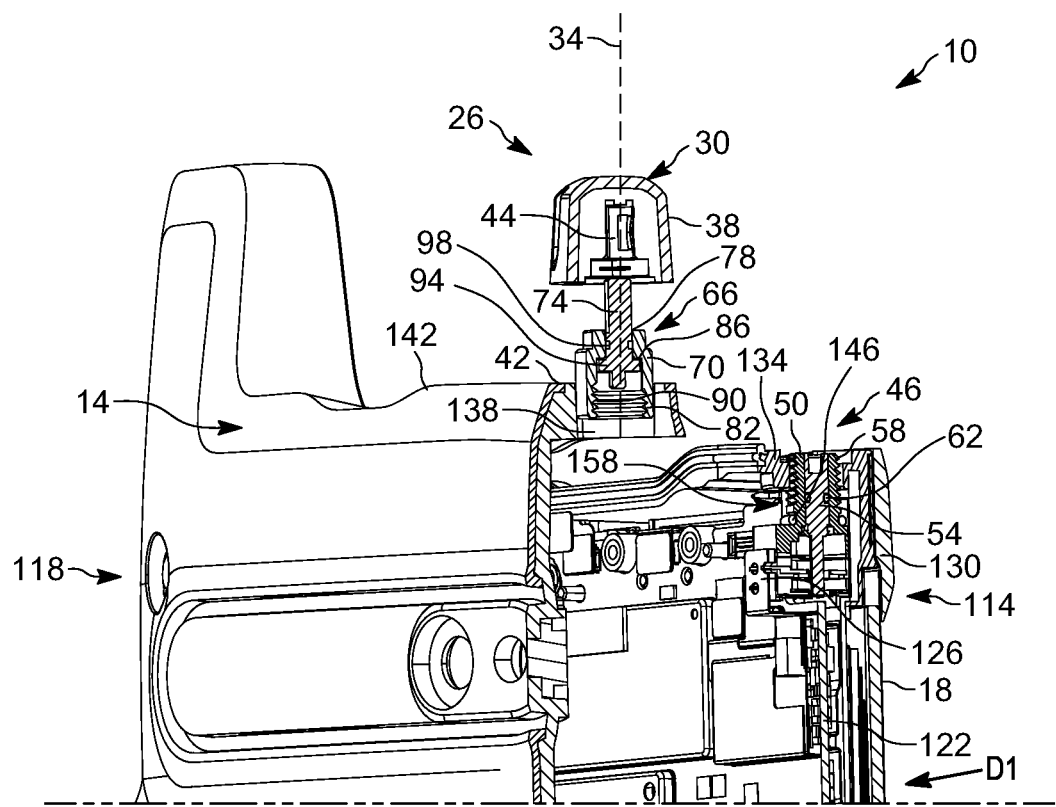
FIG. 2 is a perspective, partial cross-sectional view of the portable communication device, illustrating a first position of the volume adjustment assembly during an assembly operation.
Figure 3:
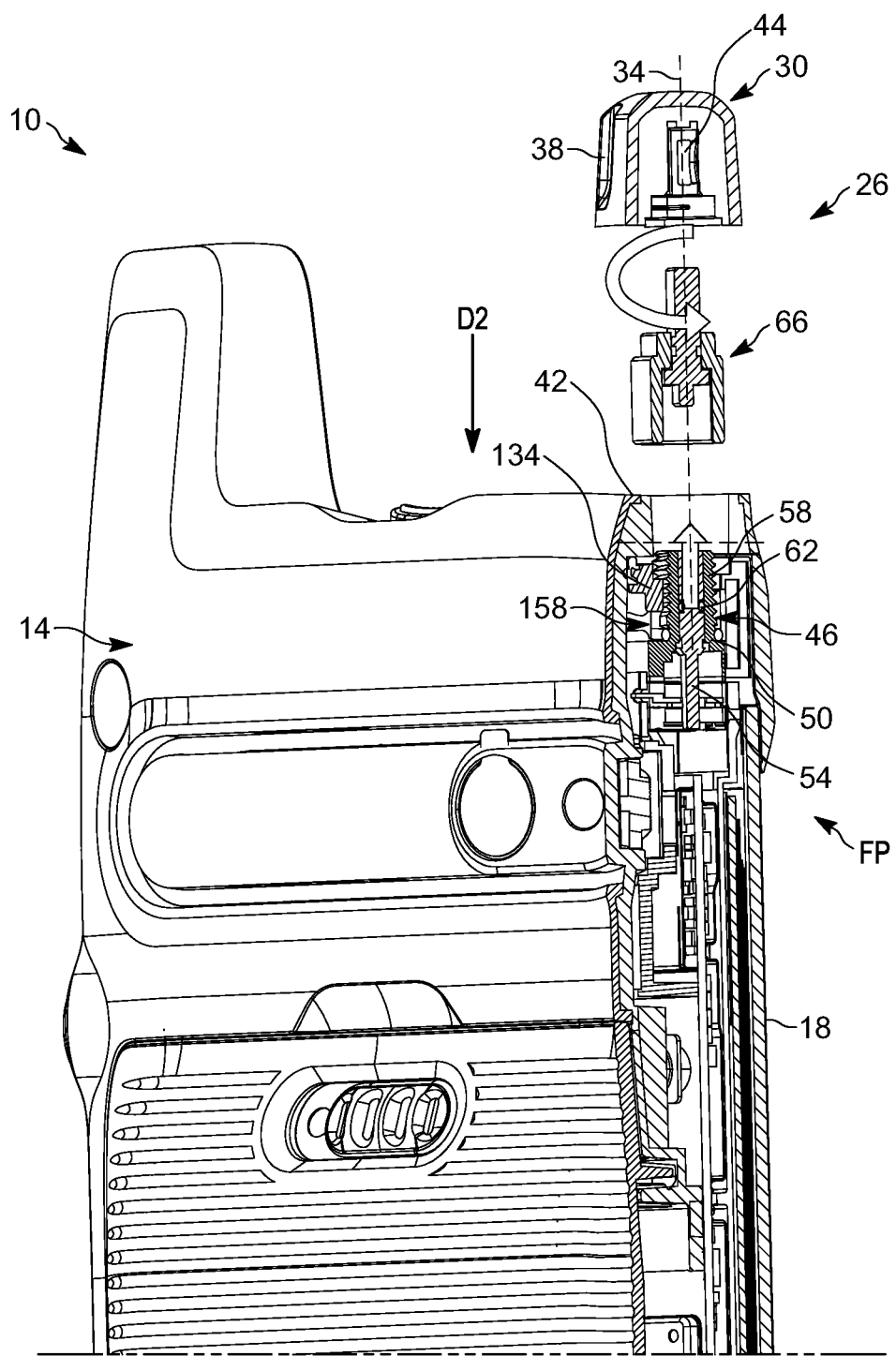
FIG. 3 is a perspective, partial cross-sectional view of the portable communication device, illustrating a second position of the volume adjustment assembly during an assembly operation.
Figure 4:
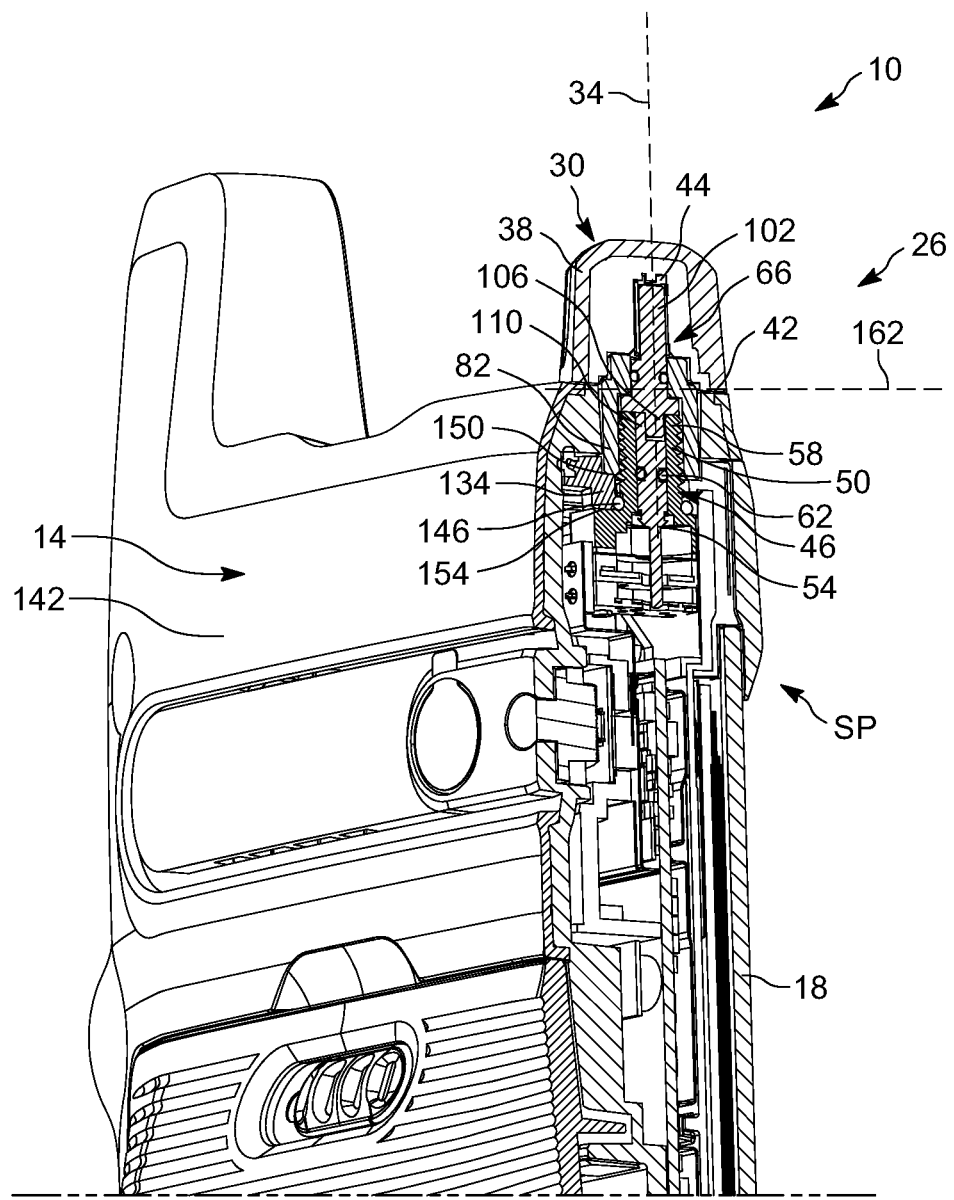
FIG. 4 is a perspective, partial cross-sectional view of the portable communication device, illustrating a third position of the volume adjustment assembly during an assembly operation.

With reference to FIGS. 2-4, the adjustment knob 30 includes an internal cavity 44. The axis 34 extends through the internal cavity 44. In the illustrated embodiment, the internal cavity 44 is an elongate cavity that extends along the axis 34. Other embodiments include an internal cavity 44 having a shape or size other than that illustrated.

With continued reference to FIGS. 2-4, the volume adjustment assembly 26 also includes a potentiometer 46. The potentiometer 46 is a variable resistor that controls a volume level on the portable communication device 10. The potentiometer 46 includes a potentiometer main body 50 and a potentiometer wiper shaft 54 disposed at least partially within the potentiometer main body 50. When the potentiometer wiper shaft 54 is rotated, a resistance level is changed, causing a difference in volume output on the portable communication device 10. In the illustrated embodiment, the potentiometer main body 50 includes a set of external threads 58. The potentiometer 46 also includes a rubber seal 62 disposed radially between the potentiometer wiper shaft 54 and the potentiometer main body 50. The rubber seal 62 permits rotation of the potentiometer wiper shaft 54 relative to the potentiometer main body 50, and also acts as a seal to inhibit or prevent water (or other liquid) from passing into an interior of the potentiometer 46 and into the portable communication device 10 (for example to establish an IP68 rating). In other embodiments, the rubber seal 62 is omitted, or is replaced with a seal and/or bearing that inhibits liquid from entering the portable communication device 10 and/or facilitates rotation of the potentiometer wiper shaft 54 relative to the potentiometer main body 50.

With continued reference to FIGS. 2-4, the volume adjustment assembly 26 also includes an adapter 66. In the fully assembled state (FIG. 4), the adapter 66 is disposed between and coupled to both the adjustment knob 30 and the potentiometer 46. The adapter 66 includes an adapter main body 70 and a separate adapter shaft 74 rotationally coupled to the adapter main body 70. With reference to FIG. 2, in the illustrated embodiment the adapter main body 70 has a first end 78 and a second, opposite end 82 spaced from the first end 78 along the axis 34. The adapter shaft 74 extends through the first end 78 of the adapter main body 70. Both first end 78 and the second end 82 are open ends. The adapter main body 70 defines a hollow structure having an internal ledge 86 disposed between the first end 78 and the second end 82, and a set of internal threads 90 disposed at the second end 82. The adapter shaft 74 includes an enlarged portion 94 that sits axially against the internal ledge 86. The adapter shaft 74 extends along the axis 34. The adapter 66 includes a rubber seal 98 disposed radially between the adapter shaft 74 and the adapter main body 70 at a location that is spaced axially from the internal ledge 86 and the enlarged portion 94. The rubber seal 98 permits rotation of the adapter shaft 74 relative to the adapter main body 70, and also acts as a seal to inhibit or prevent water (or other liquid) from passing into an interior of the adapter 66 and into the portable communication device 10. Other embodiments include different shapes and sizes for the adapter main body 70 and the adapter shaft 74 than that illustrated, as well as a different location for the rubber seal 98 and/or internal threads 90 than that illustrated. In some embodiments, the rubber seal 98 is omitted, or is replaced with a seal and/or bearing that inhibits liquid from entering the portable communication device 10 and/or facilitates rotation of the adapter shaft 74 relative to the adapter main body 70.

As illustrated in FIG. 4, in the fully assembled state a first end 102 of the adapter shaft 74 is disposed outside of the adapter main body 70 and a second end 106 of the adapter shaft 74 is disposed within the adapter main body 70. The first end 102 of the adapter shaft 74 is disposed within the internal cavity 44 of the adjustment knob 30, such that rotation of the adjustment knob 30 about the axis 34 also rotates the adapter shaft 74 about the axis 34. In some embodiments, the adjustment knob 30 fits tightly over the first end 102 (for example via an interference or friction fit). In other embodiments the adjustment knob 30 and/or the first end 102 of the adapter shaft 74 includes a keyed feature or features (for example splines and the like) that facilitate rotational engagement of the adjustment knob 30 with the adapter shaft 74.

With continued reference to FIG. 4, in the fully assembled state the second end 106 of the adapter shaft 74 is coupled to an end 110 the potentiometer wiper shaft 54, such that rotation of the adapter shaft 74 about the axis 34 also rotates the potentiometer wiper shaft 54 about the axis 34. In some embodiments, the second end 106 of the adapter shaft 74 fits tightly with the end 110 of the potentiometer wiper shaft 54 (for example via an interference or friction fit). In other embodiments the second end 106 of the adapter shaft 74 and/or the end 110 of the potentiometer wiper shaft 54 includes a keyed feature or features (for example splines and the like) that facilitate rotational engagement of the adapter shaft 74 with the potentiometer wiper shaft 54.

With reference to FIG. 2, the portable communication device 10 includes a front assembly 114 and a rear assembly 118. The front assembly 114 includes the potentiometer 46 and the display 18. The front assembly 114 also includes a printed circuit board 122, an electrical flex element 126 extending between the printed circuit board 122 and the potentiometer 46, and a first portion 130 of the main housing 14. As illustrated in FIG. 2, an interior housing 134 is disposed within (for example nested within) the first portion 130. The rear assembly 118 includes an aperture 138 extending through a second portion 142 of the main housing 14. The aperture 138 is sized and shaped to receive the adapter 66. The second portion 142 of the main housing 14 also includes the outer surface 42.

With reference to FIG. 4, in the fully assembled state a rubber seal 146 is disposed between the potentiometer main body 50 and the interior housing 134. The rubber seal 146 acts as a seal to inhibit or prevent water (or other liquid) from passing into an interior of the portable communication device 10. In some embodiments, the rubber seal 98 is omitted, or is replaced with a different seal (for example gasket or other structure) that inhibits liquid from entering the portable communication device 10. As illustrated in FIG. 4, in the fully assembled state the interior housing 134 defines a ledge 150, and the second end 82 of the adapter 66 is in abutment with the ledge 150. The interior housing 134 also defines a lower surface 154. As illustrated in FIG. 4, in the fully assembled state the potentiometer main body 50 is in abutment with the lower surface 154 of the interior housing 134.

With continued reference to FIG. 4, in the assembled state the second portion 142 of the main housing 14 is an exterior housing that extends at least partially over the interior housing 134. The entire adjustment knob 30 and a portion of the adapter 66 are disposed outwardly of the second portion 142.

With reference to FIGS. 2 and 3, during a first assembly operation of the volume adjustment assembly 26, the front assembly 114 of the portable communication device 10 slides into the rear assembly 118 of the portable communication device 10 along a first direction D1 (FIG. 2). As illustrated in FIGS. 2 and 3, the potentiometer 46 is spaced lower in the main housing 14, such that a gap 158 exists between the lower surface 154 of the interior housing 134 and the potentiometer main body 50, and such that the front assembly 114 is not obstructed from sliding along the direction D1.

During a second assembly operation, the adjustment knob 30 is coupled to the adapter 66, and the combined adjustment knob 30 and adapter 66 are moved down along the axis 34 and along a direction D2 (FIG. 3) that is perpendicular to the direction D1, such that the adapter 66 passes into the aperture 138 and the second end 106 of the adapter shaft 74 couples to the end 110 of the potentiometer wiper shaft 54.

With reference to FIGS. 3 and 4, during a third assembly operation, the adapter 66 is rotated about the axis 34. The internal threads 90 of the adapter 66 engage the external threads 58 of the potentiometer main body 50. This movement forces/pulls the potentiometer 46 from a first position FP (FIG. 3) along the axis 34 to a second position SP (FIG. 4) along the axis 34 within the portable communication device 10. In some embodiments the external and internal threads 58, 90 may be reversed, such that the potentiometer 46 includes internal threads and the adapter 66 includes external threads. During this movement, the electrical flex element 126 may move from a flexed orientation when the potentiometer 46 is in the first position FP to more of an extended orientation when the potentiometer 46 is in the second position. In some embodiments the printed circuit board 122 may move (for example vertically upwards) with the potentiometer 46 when the potentiometer 46 is moved to the second position. For example, the potentiometer main body 50 may already be mounted to the printed circuit board 122. In some embodiments the electrical flex element 126 is soldered to the printed circuit board 122, and is relatively short in length as compared for example generally to flex elements found in other devices. Additionally, in some embodiments the electrical flex element 126 is the only element that connects the printed circuit board 122 to the potentiometer 46.

The movement of the potentiometer 46 to the position illustrated in FIG. 4 results in the adapter 66 and adapter shaft 74 both being partially disposed above a plane 162 defined by the outer surface 42, and both being partially disposed below the plane 162, thus making these components accessible when the adjustment knob 30 is removed. The potentiometer 46 remains entirely below the plane 162, and the adjustment knob 30 remains entirely above the plane 162. This positioning of components also ensures, at least in some embodiments, that a majority of any force applied to the adjustment knob 30 during use of the portable communication is transferred through the adapter 66 and to a housing (for example the interior housing 134) of the portable communication device 10, rather than to the potentiometer 46. In this manner, if a high enough force is applied to the adjustment knob 30, the adjustment knob 30 will likely be the component that requires replacement. The adjustment knob 30 can then simply be replaced by removing the adjustment knob 30 and replacing the adjustment knob 30 with a new adjustment knob 30 without the need to replace the potentiometer 46. This process may also include unscrewing the adapter 66 from the potentiometer 46. In some embodiments, the adapter 66 and the adjustment knob 30 may together be removed and replaced all at once, again without requiring removal or changes to the potentiometer 46.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

We claim:

1. An adjustment assembly for a portable communication device, the adjustment assembly comprising:
    an adjustment knob configured to be rotated about an axis;

a potentiometer having a potentiometer main body and a potentiometer wiper shaft disposed within the potentiometer main body; and an adapter configured to be disposed between and coupled to both the adjustment knob and the potentiometer, wherein the adapter is configured to be rotated about the axis to draw the potentiometer linearly along the axis from a first position along the axis to a second position along the axis, wherein the adapter includes an adapter main body and an adapter shaft, wherein the adapter shaft is configured to be coupled to an end of the potentiometer wiper shaft within the potentiometer main body.

2. The adjustment assembly of claim 1, wherein a first end of the adapter shaft is disposed outside of the adapter main body and a second end of the adapter shaft is disposed within the adapter main body.

3. The adjustment assembly of claim 2, wherein the adjustment knob includes an internal cavity, and wherein the first end of the adapter shaft is configured to be disposed within the internal cavity.

4. The adjustment assembly of claim 1, wherein the potentiometer includes a rubber seal disposed radially between the potentiometer wiper shaft and the potentiometer main body.

5. The adjustment assembly of claim 1, wherein the potentiometer main body includes a set of external threads.

6. The adjustment assembly of claim 1, wherein the adapter includes a rubber seal disposed radially between the adapter shaft and the adapter main body.

7. The adjustment assembly of claim 1, wherein the adapter main body includes a first end and a second, opposite end spaced from the first end along the axis, wherein the adapter shaft extends through the first end of the adapter main body, wherein the second end of the adapter main body includes a set of internal threads, and wherein the potentiometer main body includes a set of external threads configured to engage with the internal threads.

8. The adjustment assembly of claim 1, wherein the adapter includes a set of internal threads and the potentiometer includes a set of external threads configured to engage with the internal threads to draw the potentiometer linearly along the axis from the first position to the second position within the portable communication device.

9. A portable communication device comprising:
the adjustment assembly of claim 1, wherein the adapter is disposed between and coupled to both the adjustment knob and the potentiometer;
a printed circuit board; and
an electrical flex element extending between the printed circuit board and the potentiometer of the adjustment assembly, wherein the electrical flex element is configured to move from a flexed orientation when the potentiometer is in the first position to an extended orientation when the potentiometer is in the second position.

10. The portable communication device of claim 9, further comprising an interior housing disposed within the portable communication device and a rubber seal disposed between the potentiometer and the interior housing.

11. The portable communication device of claim 10, wherein the interior housing defines a ledge, and wherein the adapter includes an end in abutment with the ledge.

12. The portable communication device of claim 11, further comprising an exterior housing that extends at least partially over the interior housing, wherein the entire adjustment knob and a portion of the adapter are disposed outwardly of the exterior housing.

13. A method of assembling a portable communication device comprising:
coupling an adjustment knob to an adapter; and
rotating the adapter about an axis to draw a potentiometer linearly along the axis from a first position within the portable communication device to a second position within the portable communication device;
wherein the portable communication device includes a main housing defining an outer surface of the portable communication device, wherein the outer surface defines a plane, wherein the potentiometer is disposed entirely within the main housing on one side of the plane in both the first position and the second position.

14. The method of claim 13, further comprising sliding a front assembly of the portable communication device into a rear assembly of the portable communication device along a first direction prior to rotating the adapter, wherein the front assembly includes the potentiometer.

15. The method of claim 14, wherein the step of rotating the adapter includes rotating the adapter about an axis that is perpendicular to the first direction, and wherein the first position and the second position are each along the axis.

16. The method of claim 13, wherein the step of rotating includes engaging internal threads on the adapter with external threads on the potentiometer.

17. The method of claim 13, further comprising applying a force to the adjustment knob, wherein at least a majority of the force is transferred to a housing of the portable communication device.

18. The method of claim 13, further comprising removing the adjustment knob and replacing the adjustment knob with a new adjustment knob without replacing the potentiometer.

19. A portable communication device comprising:
a main housing defining an outer surface of the portable communication device, wherein the outer surface defines a plane;
an adjustment knob configured to be rotated about an axis that extends through the plane;
a potentiometer disposed entirely within the main housing on one side of the plane; and
an adapter disposed between and coupled to both the adjustment knob and the potentiometer;
wherein the adapter is configured to be rotated about the axis to draw the potentiometer linearly along the axis from a first position within the portable communication device to a second position within the portable communication device.

20. The portable communication device of claim 19, wherein the adapter includes an adapter shaft coupled to the potentiometer.

21. The portable communication device of claim 19, wherein the adjustment knob is disposed entirely outside of the main housing on an opposite side of the plane.

* * * * *